(12) United States Patent
Mani

(10) Patent No.: US 7,944,737 B2
(45) Date of Patent: May 17, 2011

(54) MAGNETIC MEMORY CELL BASED ON A MAGNETIC TUNNEL JUNCTION (MTJ) WITH INDEPENDENT STORAGE AND READ LAYERS

(75) Inventor: Krishnakumar Mani, San Jose, CA (US)

(73) Assignee: MagSil Corporation, Santa Clara, CA (US)

( * ) Notice: Subject to any disclaimer, the term of this patent is extended or adjusted under 35 U.S.C. 154(b) by 26 days.

(21) Appl. No.: 12/184,224

(22) Filed: Jul. 31, 2008

(65) Prior Publication Data

US 2009/0067231 A1 Mar. 12, 2009

Related U.S. Application Data

(60) Provisional application No. 60/953,162, filed on Jul. 31, 2007.

(51) Int. Cl.
*G11C 11/00* (2006.01)

(52) U.S. Cl. ...................................... 365/158; 365/173
(58) Field of Classification Search .................. 365/158, 365/173
See application file for complete search history.

(56) References Cited

U.S. PATENT DOCUMENTS

| | | | |
|---|---|---|---|
| 7,486,545 B2* | 2/2009 | Min et al. ...................... | 365/158 |
| 2005/0068683 A1* | 3/2005 | Gill ................................ | 360/314 |
| 2005/0243479 A1* | 11/2005 | Gill ............................ | 360/324.12 |
| 2006/0245242 A1* | 11/2006 | Rizzo et al. .................... | 365/171 |
| 2007/0243638 A1* | 10/2007 | Horng et al. ...................... | 438/3 |

* cited by examiner

*Primary Examiner* — Michael T Tran
(74) *Attorney, Agent, or Firm* — Hahn Moodley LLP; Vani Moodley, Esq.

(57) ABSTRACT

Embodiments of the invention magnetic memory device, comprising: a magnetic tunnel junction (MTJ) which includes a first free layer optimized for reading; and a second free layer separate from the MTJ and optimized for writing.

13 Claims, 15 Drawing Sheets

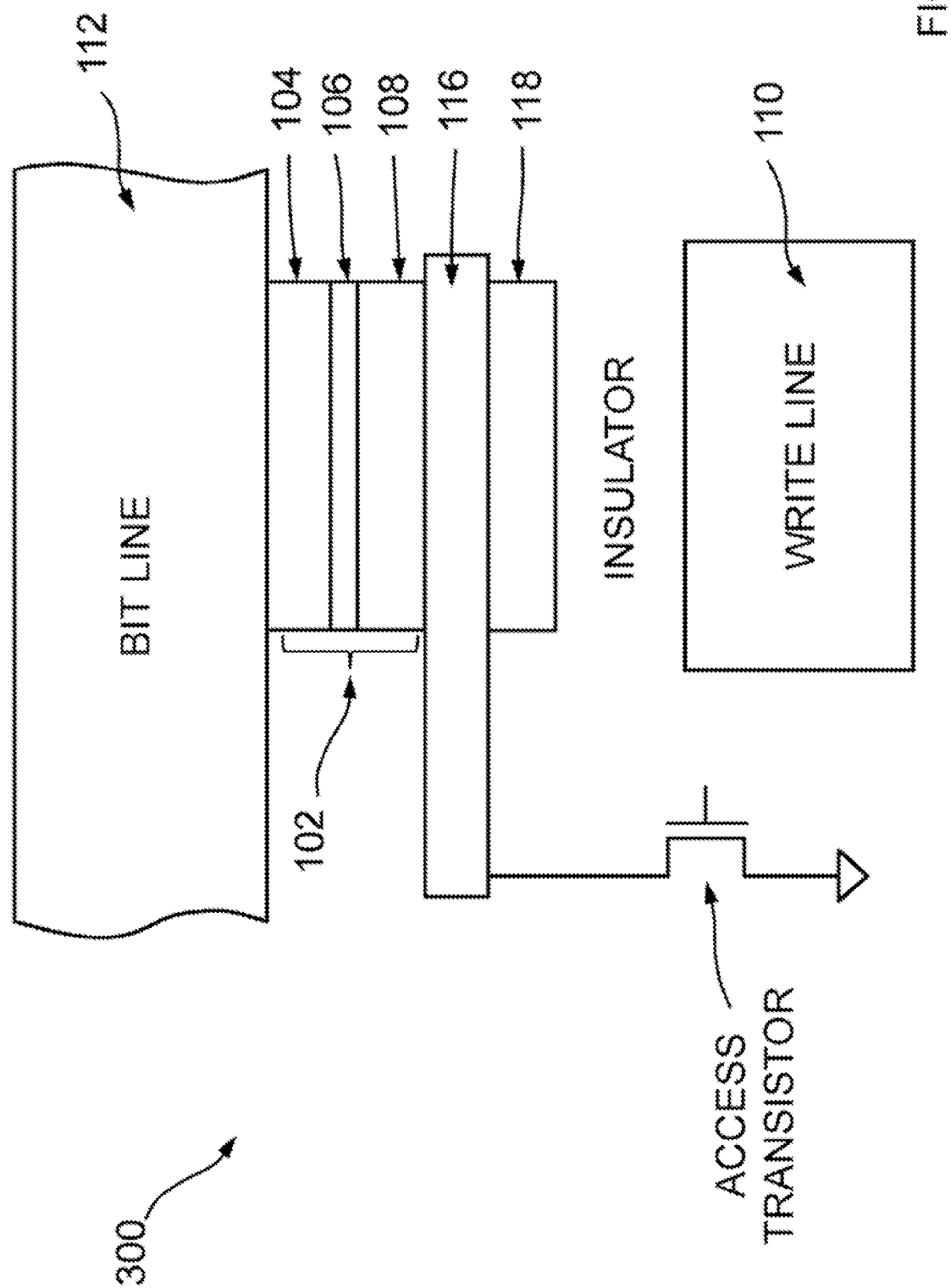

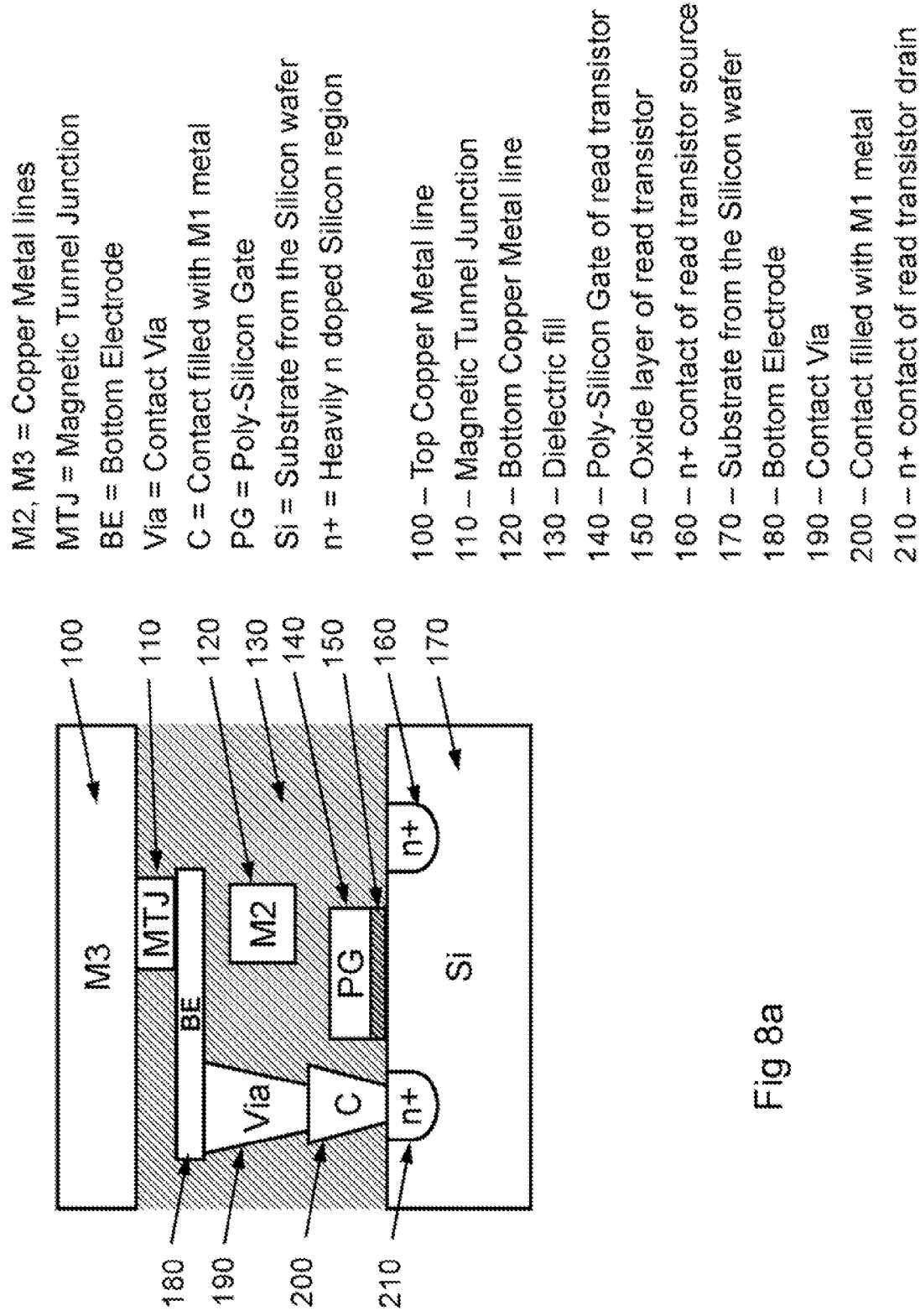

Fig 8a

Legend
M2, M3 = Copper Metal lines
MTJ = Magnetic Tunnel Junction
BE = Bottom Electrode
Via = Contact Via
C = Contact filled with M1 metal
PG = Poly-Silicon Gate
Si = Substrate from the Silicon wafer
n+ = Heavily n doped Silicon region 100 – Top Copper Metal line
110 – Magnetic Tunnel Junction
120 – Bottom Copper Metal line
130 – Dielectric fill
140 – Poly-Silicon Gate of read transistor
150 – Oxide layer of read transistor
160 – n+ contact of read transistor source
170 – Substrate from the Silicon wafer
180 – Bottom Electrode
190 – Contact Via
200 – Contact filled with M1 metal
210 – n+ contact of read transistor drain

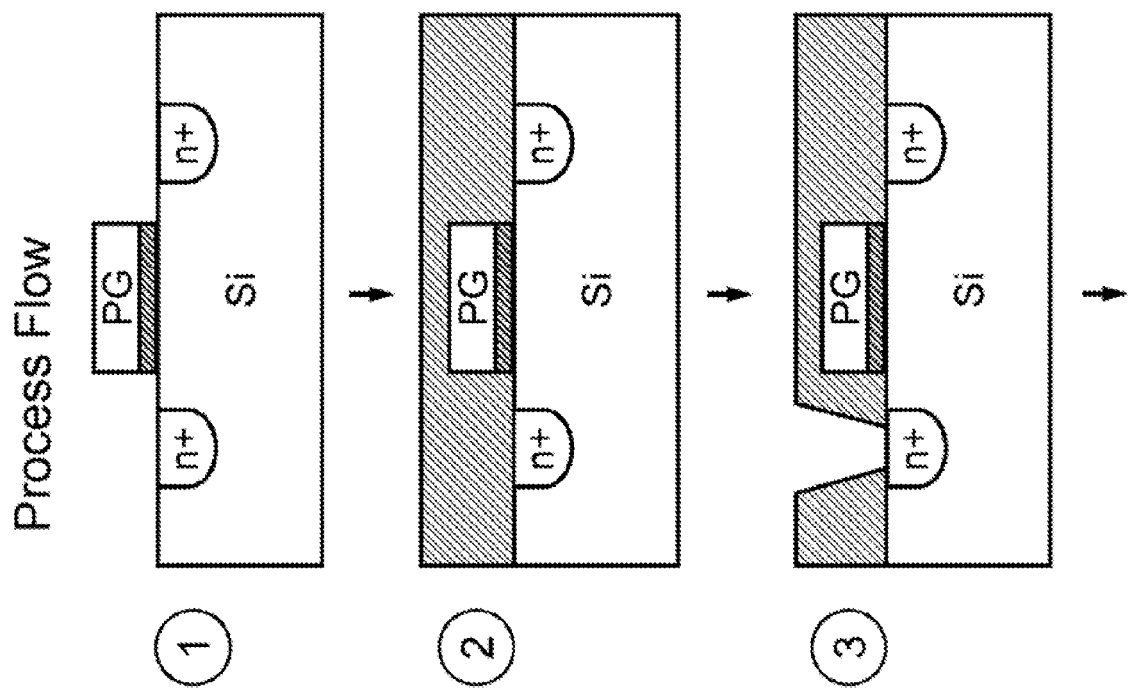
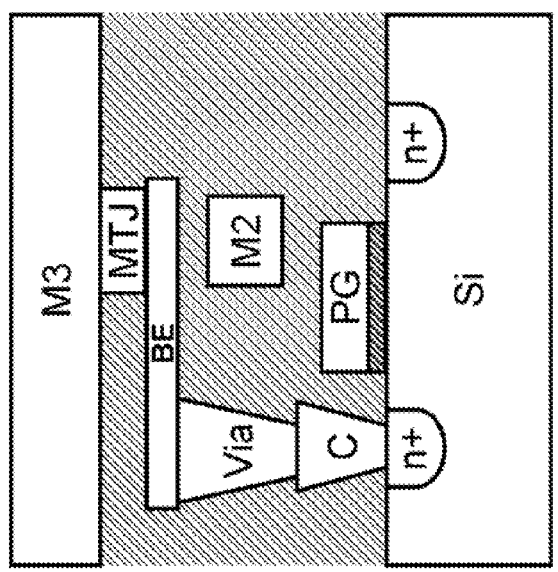
Fig 8b

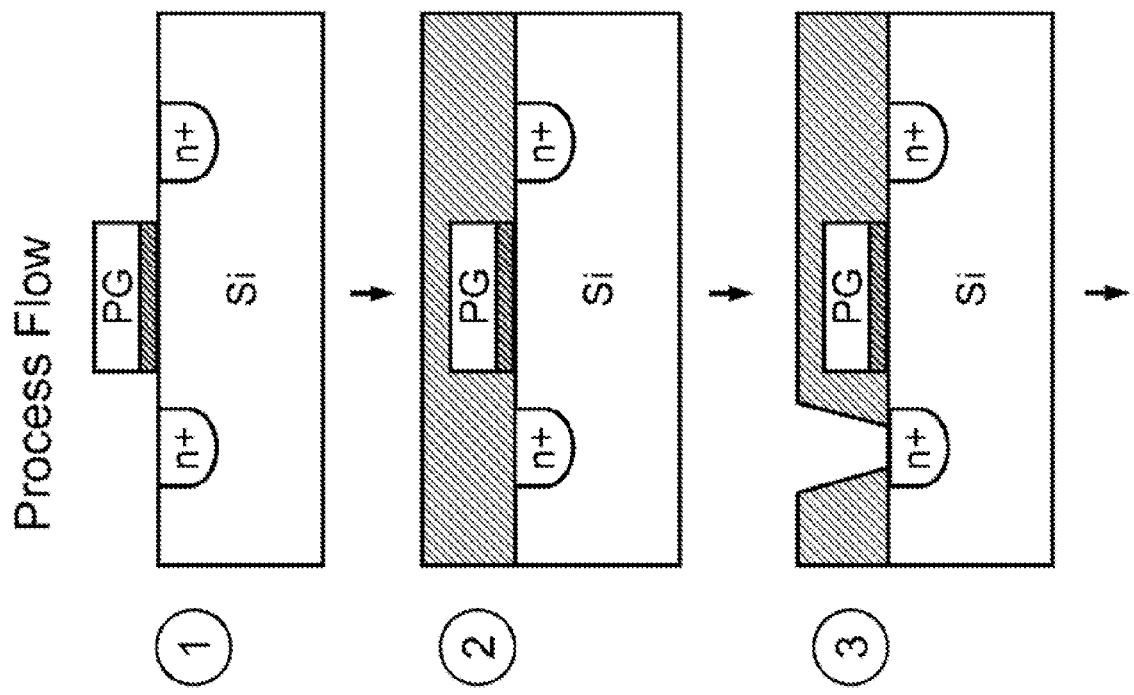
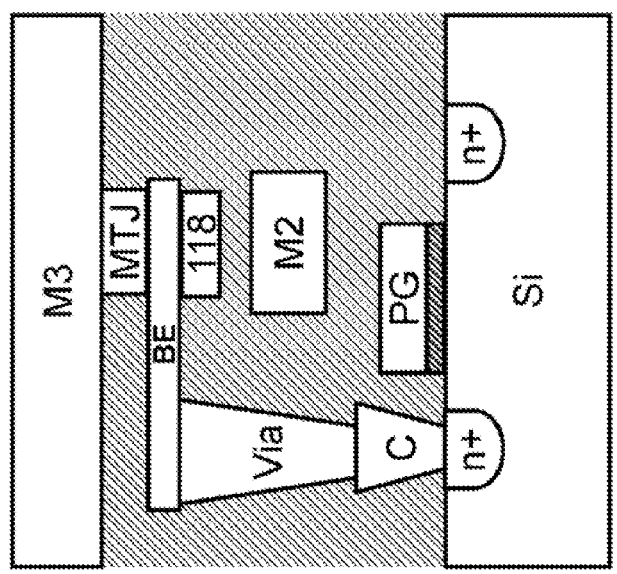
Fig 9a

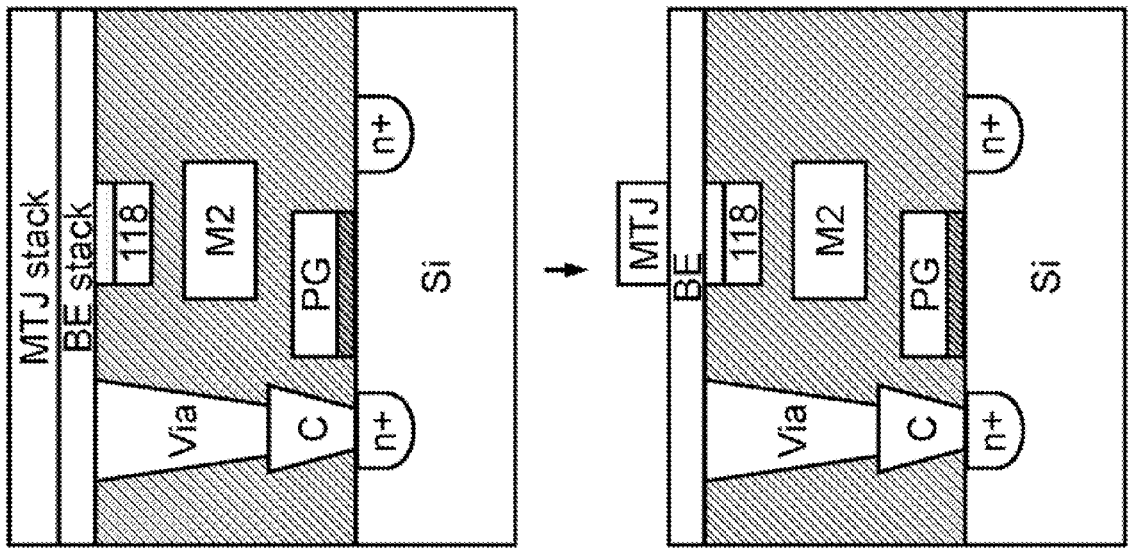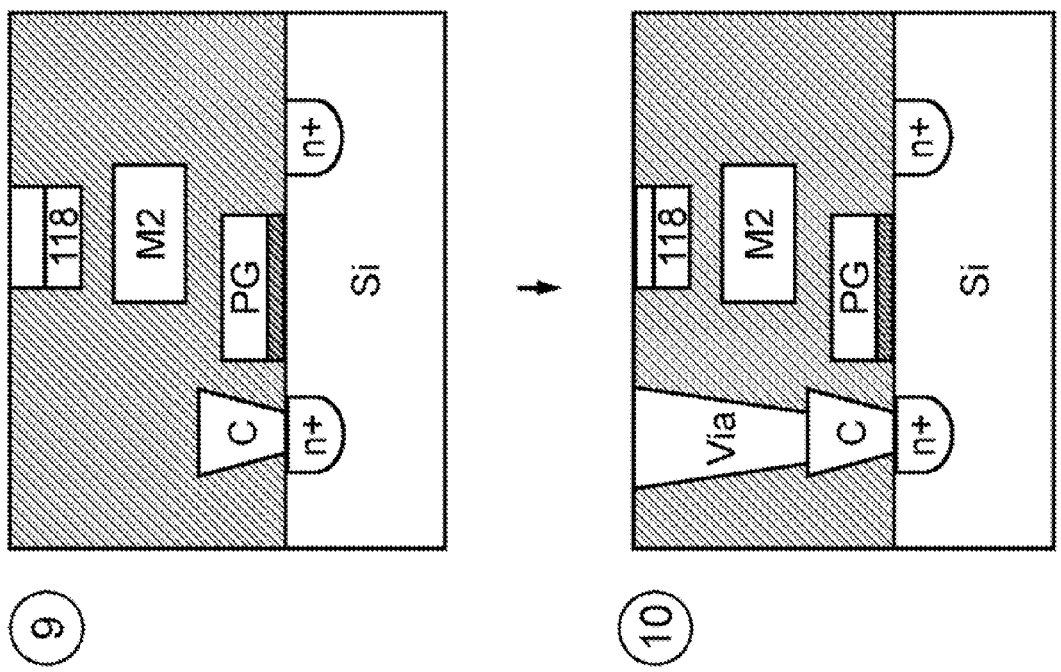
Fig 9c

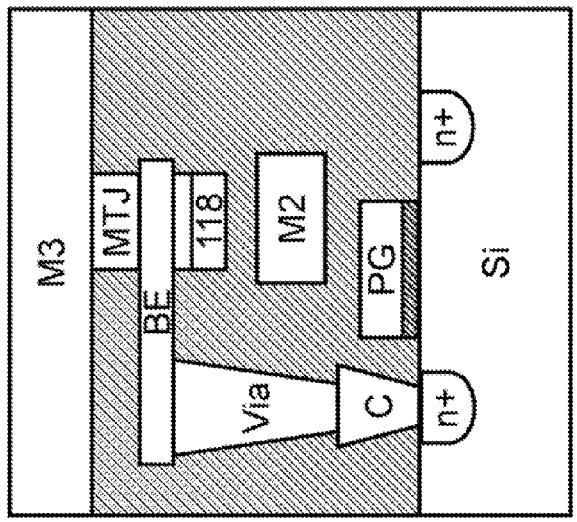
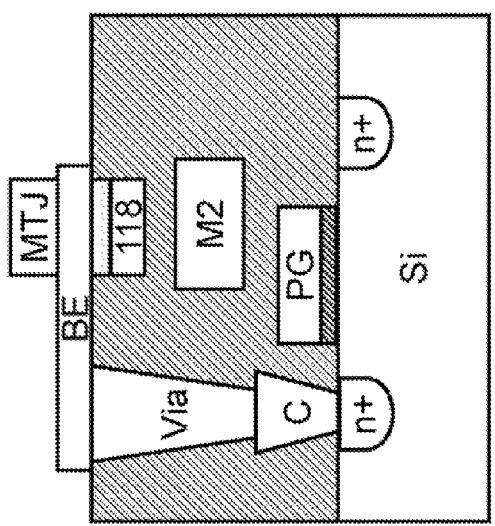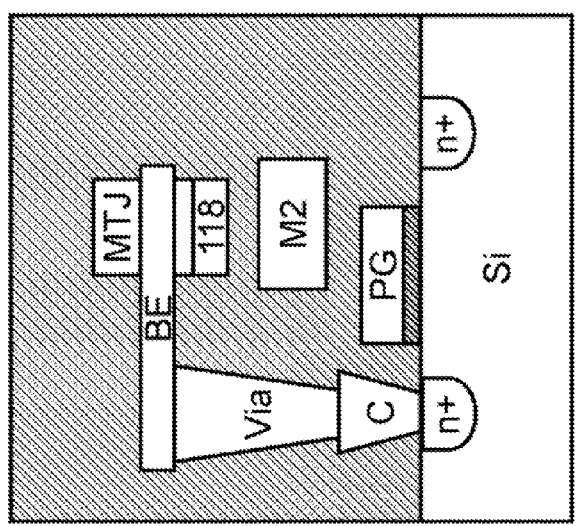
Fig 9d

US 7,944,737 B2

MAGNETIC MEMORY CELL BASED ON A MAGNETIC TUNNEL JUNCTION (MTJ) WITH INDEPENDENT STORAGE AND READ LAYERS

This application claims the benefit of priority to U.S. Provisional Patent Application No. 60/953,162 filed Jul. 31, 2007, and entitled "Magnetic Memory Cell Based on a Magnetic Tunnel Junction with Independent Storage and Write Layers", the specification of which is hereby incorporated by reference.

FIELD

Embodiments of the invention relate to magnetic memory cells and devices built using magnetic memory cells.

BACKGROUND

A magnetic tunnel junction (MTJ) generally comprises a "pinned" ferromagnetic layer(hereinafter the "fixed layer") whose magnetization is oriented in the plane of the layer but is fixed so as to not be able to rotate in the presence of an applied magnetic field in a range of interest, and a "free" ferromagnetic layer (hereinafter the "free layer") whose magnetization is able to be rotated in the plane of the layer relative to the fixed magnetization of the pinned ferromagnetic layer. Sandwiched between the fixed and the free layers the MTJ comprises an insulating tunnel barrier layer located between and in contact with both ferromagnetic layers. MTJs have been proposed for use in memory cells in a magnetic random access (MRAM) array.

SUMMARY OF THE INVENTION

Embodiments of the present invention disclose an MRAM cell that includes a MTJ with a free layer optimized for reading, and a separate storage layer disposed outside the MTJ, and optimized for storage or writing.

Other aspects of the invention will be apparent from the detailed description below:

BRIEF DESCRIPTION OF THE DRAWINGS

While the appended claims set forth the features of the present invention with particularity, the invention, together with its objects and advantages, will be more readily appreciated from the following detailed description, taken in conjunction with the accompanying drawings, wherein:

FIG. 3 shows schematic drawing of a memory cell comprising an MTJ and a separate storage layer wherein the read current does not flow through the storage layer;

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
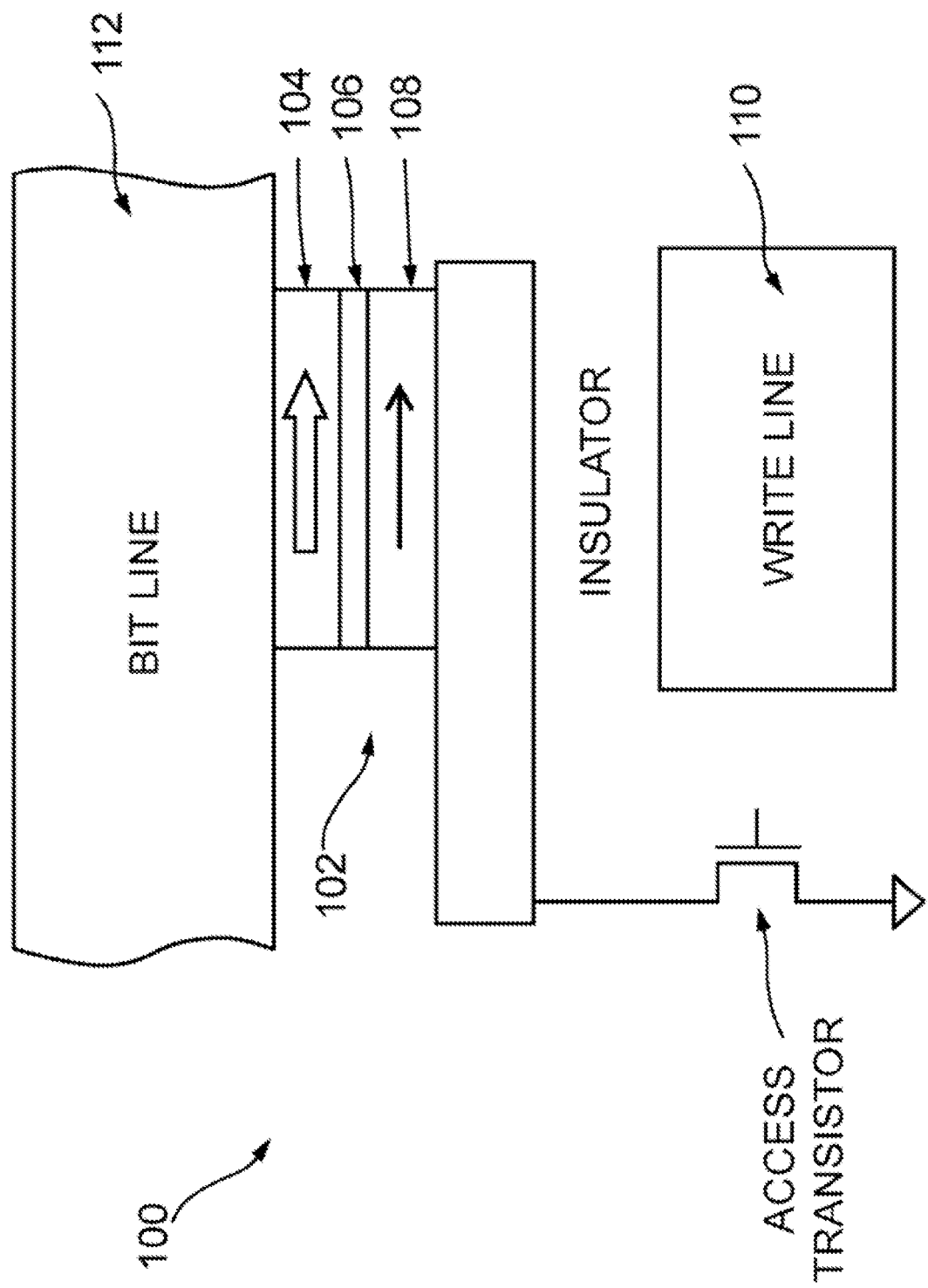
FIG. 1 shows schematic drawing of a memory cell comprising an MTJ.
Figure 4A:
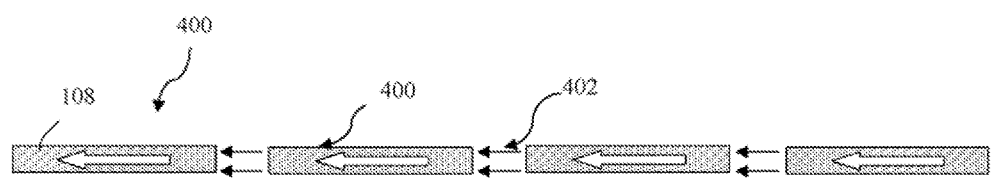
FIGS. 4a and 4b illustrate how the presence of the storage layer outside the MTJ can reduce inter-bit disturbance in a memory array.

Referring to FIG. 1 of the drawings, there is shown a magnetic random access memory(MRAM) cell 100 in accordance with the prior art. As will be seen, the cell 100 comprises an MTJ 102 which includes a fixed layer 104, an insulating (e.g. oxide) layer 106, and a free layer 108. The free layer 108 defines a storage layer for the cell 100. As such, the free layer 108 is optimized so that it can be written to with a minimum amount of energy. For purposes of writing, the cell 100 comprises a bit line 112 that extends horizontally as shown in FIG. 1 and a write line 110 that extends into the plane of FIG. 1. Because the magnetic orientation of the free layer 108 has to be modified with a minimum amount of energy, it is desirable to make the free layer 108 as thin as possible. However if the free layer 108 is made too thin it becomes unstable with the result that the ambient thermal energy can randomly flip or change the orientation of the free layer. This phenomenon is known as "blinking bits". In some cases, the free layer 108 contains manufacturing defects such as particles in the manufacturing ambient can make the free layer resistant to changing its magnetic orientation under a magnetic field generated by write current. This phenomenon is known as pinning of the free layer which results in "dead bits". Moreover, when memory cells 100 of FIG. 1 are organized in an array the magnetic field of the free layer 108 of neighboring memory cells influence each other which results in data loss or corruption (as is illustrated in FIG. 4a). This disturbance limits the distance between the memory cells thereby limiting memory density. This is one of the primary reasons why existing MRAM memory arrays cannot be scaled to very high densities.

Figure 2:
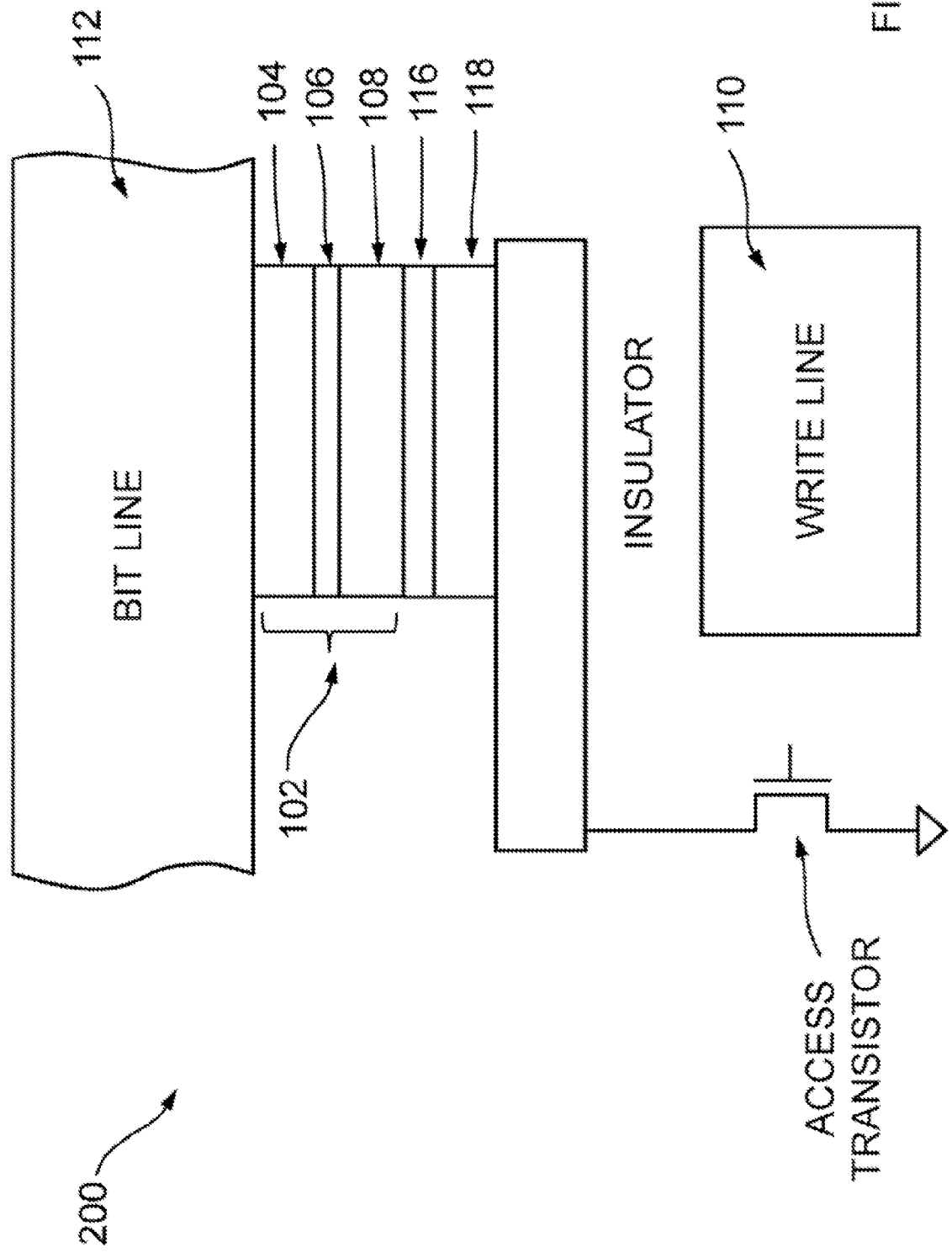
FIG. 2 shows schematic drawing of a memory cell comprising an MTJ and a separate storage layer, in accordance with one embodiment of the invention.

Referring now to FIG. 2 of the drawings, there is shown an MRAM cell 200, in accordance with one embodiment of the invention. In the FIG. 2, components or parts that are the same or are similar to corresponding parts of the cell 10 shown in FIG. 1, have been indicated using the same reference numerals. As will be seen, the cell 200 includes an MTJ 102, a write line 110, and a bit line 112.

Figure 4B:
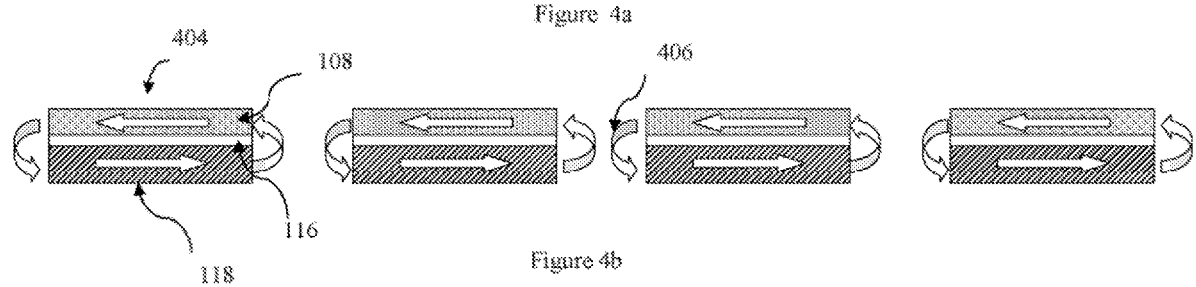

Additionally, the cell 200 includes a second free layer 118. In one embodiment, the second free layer 118 is separated from the first free layer 108 by a spacer or exchange layer 116. The second free layer 118 defines a storage layer for the cell 200. Advantageously, the first free layer 108 is optimized for reading and is referred as a read layer", whereas that second free layer 118 is optimized for storage. Thus, the cell 200 requires a minimum amount of energy for writing, and has the advantage of having a high thermal stability due to anti-ferromagnetic coupling of free layer 108 and the storage optimized layer 118. Moreover, magnetic coupling between the layer 118 and the layer 108 prevents any inadvertent changes in the magnetic orientation of the layer 108 to overcome the phenomenon of blinking bits and provide sufficient magnetic energy to help the free layer 108 to overcome the "pinning" phenomenon and eliminate dead bits. Moreover when memory cells 200 of FIG. 2 are organized in an array the magnetic field of the free layer 108 and storage layer 118 are anti-ferromagnetically and magnetostatically coupled. Hence the magnetic lines of force of the free layer 108 are terminated within the memory cell itself. Therefore the bit to bit disturbance is reduced by many times. This reduced disturbance helps reduce the distance between the memory cells thereby increasing the memory density manyfold. FIGS. 4a and 4b illustrate how the presence of the storage layer outside the MTJ can reduce inter-bit disturbance in a memory array. FIG. 4a shows a plurality of magnetic bits 400 occurring along a row in a memory array. Each magnetic bit 400 includes a MTJ that has a free layer 108. As can be seen a magnetic field indicated by lines 402 due to each bit affects the neighboring bits. This can lead to data loss or corruption. FIG. 4b shows magnetic bits 404 that have an MTJ coupled to a separate and independent storage layer 118 as described. In this case storage layers 118 and the free layers 108 are magnetically coupled (magnetostatically and through exchange coupling by an intermediate exchange or spacer layer). The magnetic fields 406 due to the free layer 108 is completely terminated inside each bit 404 and the influence of this free layer 108 and storage layer 118 combination on the neighbors is minimal. This reduced disturbance due to neighboring bits increases the memory cell density and hence reduces the device cost.

In the memory cell 200 the MTJ is used only for reading or sensing the data and not as a memory or a storage device. The data is stored entirely in the storage layer 118 which is independent of the MTJ. In accordance with different embodiments of the invention, the storage layer 118 in turn may be made of one or more layers of ferromagnetic and conductive layers. Advantageously, the free layer 108 of the MTJ 102 can be independently optimized for reading or sensing purpose only, whereas the storage layer 118 can be independently optimized for write or data storage. The storage layer 118 and the sensor(MTJ 102) can be coupled by a spacer or exchange layer. In one embodiment the layers 108 and 118 may be designed so that a switching field of the free layer 108 is only 20-50 Oe, whereas the switching field of the storage layer 118 is higher, say 100 Oe.

As mentioned, one of the advantages of the present inventions is that is that the layer 108 of the MTJ can be optimized for reading, independently of the layer 118 which can be optimized for writing or data storage. In accordance with different embodiments of the invention optimizing that layers 108 and 118 independently for reading and writing, respectively may include changing the shapes, materials, thicknesses, etc. of the layers. For example, in one embodiment that the layer 108 may have a rectangular cross-section, whereas the layer 118 may have an ellipsoidal or circular cross-section.

Figure 5A:
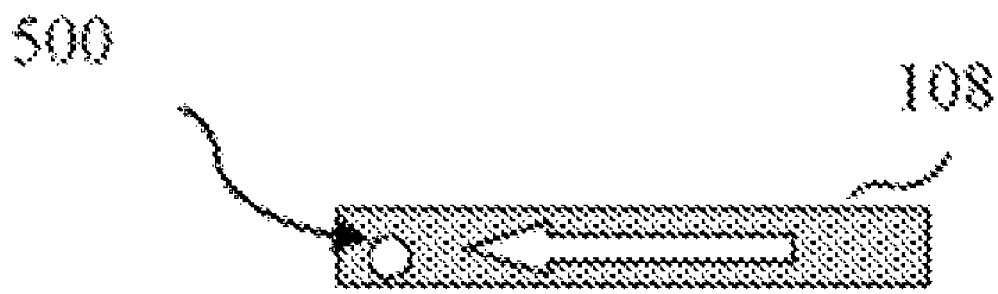
FIG. 5a shows a free layer with a manufacturing defect that causes an increase in the magnetic field required to switch the free layer.
Figure 5B:
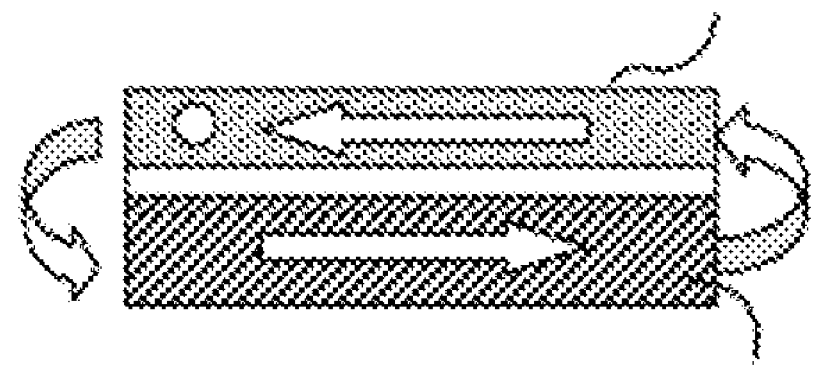
FIG. 5b shows illustrates how the independent storage layer reduces the problem of pinning.

Referring to FIG. 5a, the manufacturing of magnetic devices involves the deposition of ferromagnetic films such as layer 108. During said manufacturing there can be defects 500 in the deposition of films(inclusion of foreign materials or missing materials). This often increases the magnetic field required to switch the magnetic orientation by many times. For example if the ferromagnetic film was designed to switch with 50 Oersted of field the manufacturing defects mentioned above could result in a switching field of 50 Oe to 100 Oe. This means that the memory cell cannot switch. As is illustrated in FIG. 5b the storage layer 118 which is approximately of 100 Oe magnetic strength can aid the free layer 108 to switch correctly by magnetically coupling with the free layer. This results in the built-in tolerance for manufacturing defects.

Referring now to FIG. 3 of the drawings, there is shown an MRAM cell 300, in accordance with one embodiment of the invention. In the FIG. 3, components or parts that are the same or are similar to corresponding parts of the cell 10 shown in FIG. 1 or cell 200 shown in FIG. 2, have been indicated using the same reference numerals. In MRAM cells 100 and 200 a read current flows from 112 through 104,106,108 or through 104,106,108,116 and 118 and through the bottom lead and the access transistor. In MRAM cell 300 the read current flows through layers 104,106,108,116 and through the bottom lead and the access transistor. This cell avoids the current flow through storage layer 118 where the data is stored. This implementation results in very high long term reliability of the data.

Figure 6:
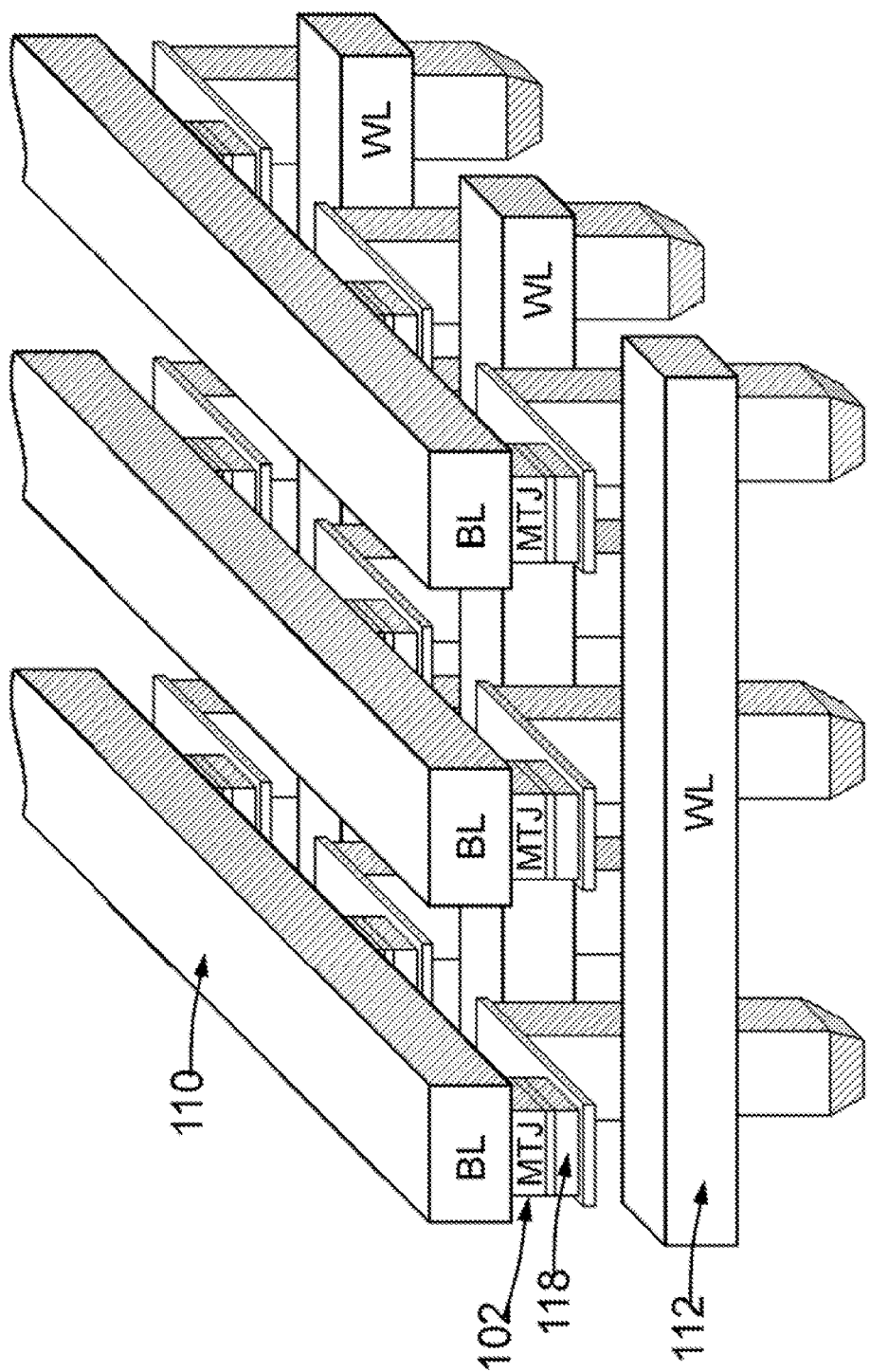
FIGS. 6 and 7 show exemplary 3×3 memory arrays, in accordance with embodiments of the invention.
Figure 7:
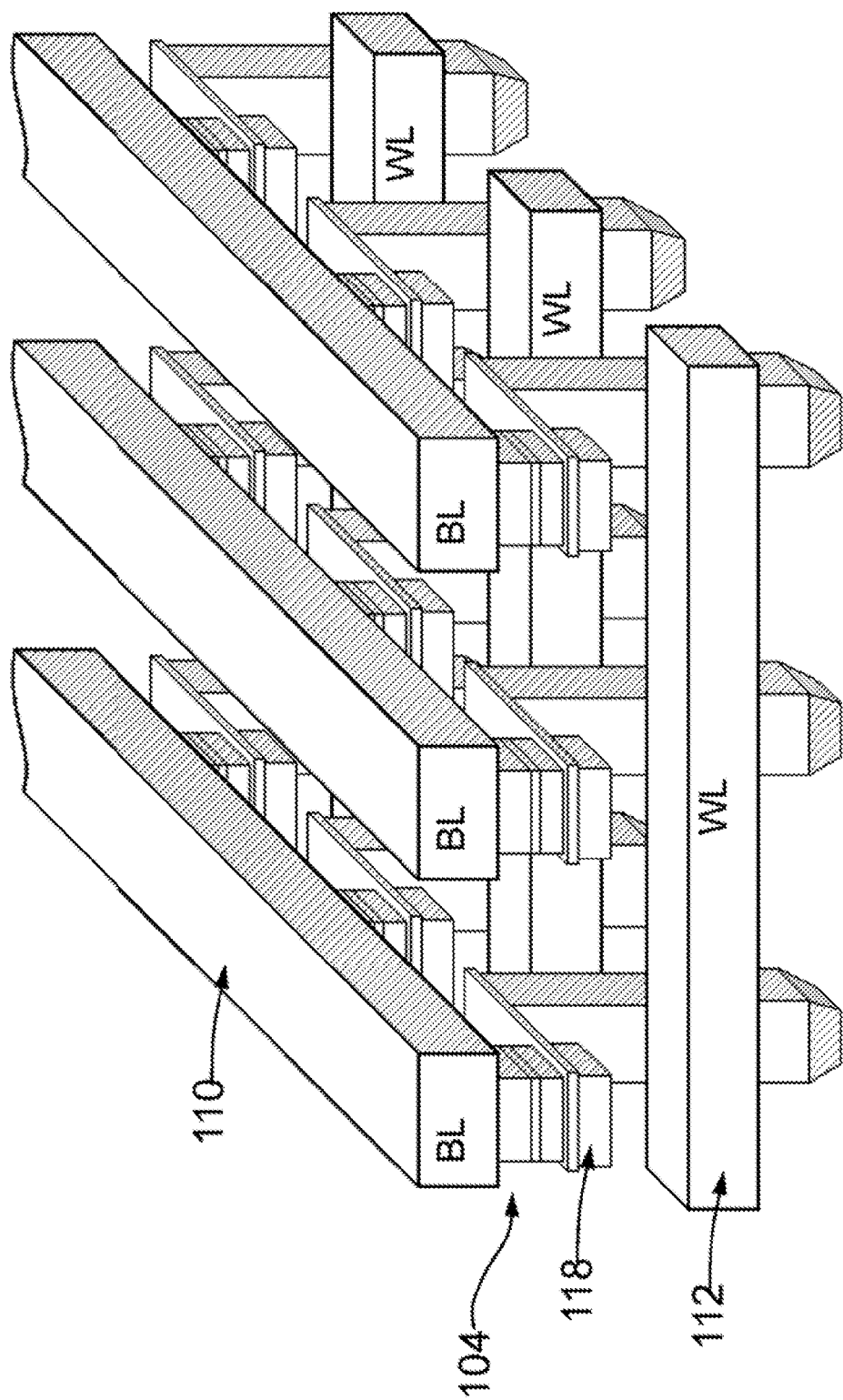

In one embodiment, the MRAM cells 200, and 300 may be disposed in an array to form a hi-density magnetic memory array. FIGS. 6 and 7 show exemplary 3×3 memory arrays that may be built using the cells 200 and 300, respectively, in accordance with one embodiment.

Figure 8C:
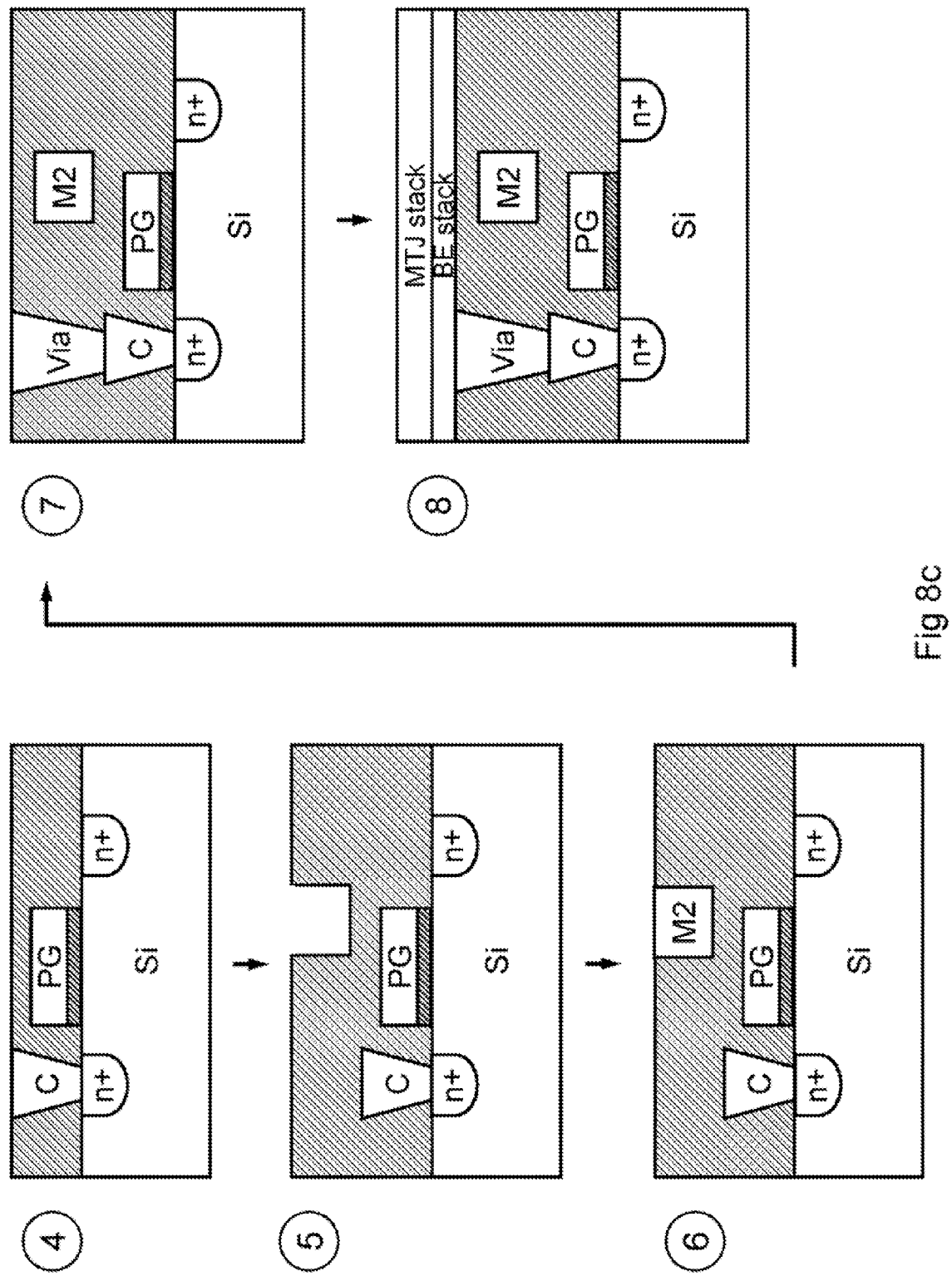
FIGS. 8 and 9 illustrate a process flow for manufacturing MRAM cell, in accordance with embodiments of the invention.
Figure 8D:
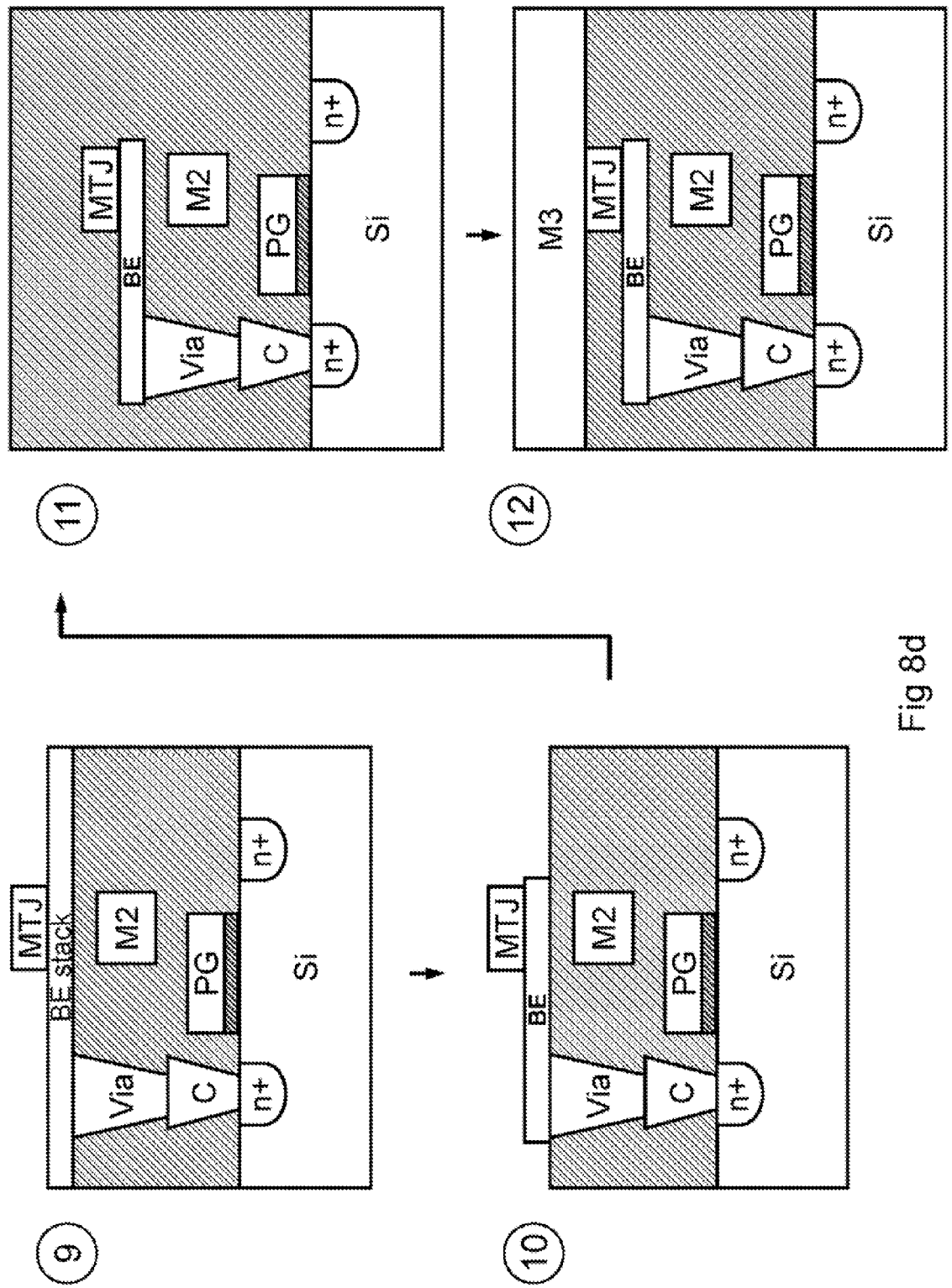

Referring now to FIG. 8 of the drawings, there is shown a process for manufacturing the memory devices 200 of the present invention, in accordance with one embodiment. In FIG. 8, for brevity, the combination of the MTJ 102, exchange layer 116, and the independent storage layer will be referred to as the magnetic stack. Referring to FIG. 8b, the CMOS semiconductor manufacturing steps prior to the transistor are not described as they are known to one of ordinary skill in the art. FIG. 8c describes the steps for laying current carrying conductors M2 (known in the industry as Metal2), deposition of the magnetic stack and the bottom electrode(BELT) stack. The Metal2 can be manufactured using sputtering, lithography and etching techniques which are widely used in the semiconductor industry. The magnetic stack and bottom electrode stack can be deposited by techniques such as sputtering. Referring to FIG. 8d the magnetic stack is defined by photolithographic step followed by an etching technique such as RIE (Reactive Ion Etching). Following the definition of magnetic stack the Bottom Electrode is also defined in a manner similar to the magnetic stack lithography and etch. Then M3 (known as Metal 3 in the semiconductor industry) conductor is deposited and defined using standard techniques. The magnetic annealing step to set the magnetic orientation of the memory cell is known to the one of ordinary skill in the art and is not described. The device is adequately passivated by a dielectric. The process steps in Figure includes:

Process Steps
1. CMOS transistor fabrication completed
2. Oxide deposition
3. Contact hole definition
4. Contact hole fill+Chemical Mechanical Planarization (CMP)
5. Oxide deposition+M2 trench definition
6. M2 fill+CMP
7. Oxide deposition+Via definition
8. Bottom Electrode+MTJ Stack deposition
9. MTJ patterning using hard mask
10. Bottom Electrode patterning
11. Oxide deposition+CMP
12. M3 Definition (Damascene)

Figure 9B:
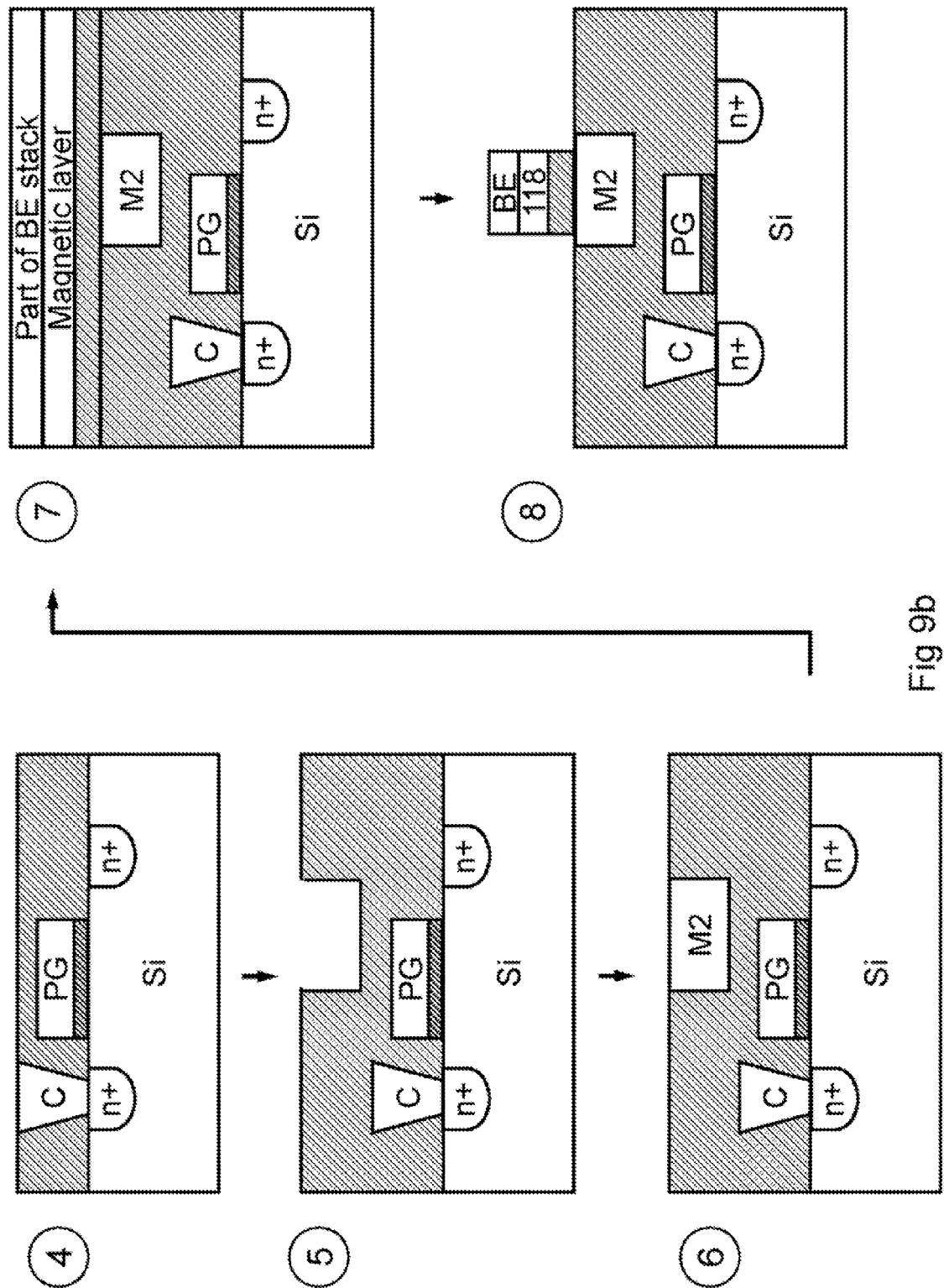

The manufacturing method for the devices 300 is shown in FIG. 9*a* to 9*d*. Most of all the manufacturing steps are similar to the one described above. Referring to FIG. 9*c* the unique step that needs to be highlighted is the storage layer 118 which is deposited and defined by lithographic and etching techniques prior to the fabrication of the MTJ. This results in the increased reliability of the memory cell as the read current does not flow through the storage layer. The process steps shown in FIG. 9 includes the following:

Process Steps
1. CMOS transistor fabrication completed
2. Oxide deposition
3. Contact hole definition
4. Contact hole fill+Chemical Mechanical Planarization (CMP)
5. Oxide deposition+M2 trench definition
6. M2 fill+CMP
7. Storage layer stack deposition
8. Storage layer patterning
9. Oxide deposition+CMP
10. Via definition
11. Bottom Electrode+MTJ Stack deposition
12. MTJ patterning using hard mask
13. Bottom Electrode patterning
14. Oxide deposition+CMP
15. M3 Definition (Damascene)

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A method for improving a reliability of an MRAM cell comprising
   providing a Magnetic Tunnel Junction (MTJ) having a first free layer of rectangular cross-section;
   positioning a second free layer adjacent to the first free layer, wherein the second free layer is independent of the first free layer and defines a storage layer to hold data; wherein the second free layer is of non-rectangular cross-section; and
   using the first free layer as a read layer to read data held by the second storage layer.

2. The method of claim 1, further comprising optimizing the first free layer for reading.

3. The method of claim 1, further comprising optimizing the second free layer is for storage.

4. The method of claim 1 or claim 2, wherein the optimizing comprises differentiating the first free layer from the second free layer in terms of one or more of shape, thickness, and material.

5. The method of claim 1, wherein the second free layer has an ellipsoidal cross section.

6. A magnetic memory cell, comprising:
   a magnetic tunnel junction (MTJ) which includes a first free layer optimized for reading; wherein the first free layer of rectangular cross-section; and
   a second free layer separate from the MTJ and optimized for writing; wherein the second free layer is of non-rectangular cross-section.

7. The magnetic memory cell of claim 6, wherein the first and second free layers are different in terms of one or more of material, shape, and thickness.

8. The magnetic memory cell of claim 6, wherein the first free layer is optimized for reading in that it requires a lower operative switching field than the second free layer.

9. The magnetic memory cell of claim 6, wherein the second free layer has an ellipsoidal cross section.

10. A magnetic memory array, comprising:
    a plurality of magnetic memory cells, each comprising:
       a magnetic tunnel junction (MTJ) which includes a first free layer optimized for reading; wherein the first free layer is of rectangular cross-section; and
       an second free layer separate from the MTJ and optimized for writing;
    wherein the second free layer is of non-rectangular cross-section; and
    read and write lines to energize the magnetic memory cells.

11. The magnetic memory array of claim 10, wherein the first and second free layers are different in terms of one or more of material, shape, and thickness.

12. The magnetic memory array of claim 10, wherein the first free layer is optimized for reading in that it requires a lower operative switching field than the second free layer.

13. The magnetic memory array of claim 10, wherein the second free layer has an ellipsoidal cross section.

* * * * *